US012763588B2

(12) United States Patent
Jung

(10) Patent No.: US 12,763,588 B2
(45) Date of Patent: Oct. 13, 2026

(54) BATTERY MANAGEMENT APPARATUS AND METHOD, AND BATTERY SYSTEM INCLUDING DETERMINING WHETHER TO REPLACE FIRST AND SECOND BATTERY MODULES

(71) Applicant: LG Energy Solution, Ltd., Seoul (KR)

(72) Inventor: Jin-Kyu Jung, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 856 days.

(21) Appl. No.: 17/625,200

(22) PCT Filed: Sep. 16, 2020

(86) PCT No.: PCT/KR2020/012511

§ 371 (c)(1),
(2) Date: Jan. 6, 2022

(87) PCT Pub. No.: WO2021/054723

PCT Pub. Date: Mar. 25, 2021

(65) Prior Publication Data

US 2022/0263328 A1 Aug. 18, 2022

(30) Foreign Application Priority Data

Sep. 20, 2019 (KR) ........................ 10-2019-0116254

(51) Int. Cl.
*H02J 7/40* (2026.01)
*G01R 31/382* (2019.01)
(Continued)

(52) U.S. Cl.
CPC .............. *H02J 7/40* (2026.01); *G01R 31/382* (2019.01); *G01R 31/392* (2019.01); (Continued)

(58) Field of Classification Search
CPC .. H02J 7/00032; H02J 7/00034; H02J 7/0013; H02J 7/0036; H02J 7/0047;
(Continued)

(56) References Cited

U.S. PATENT DOCUMENTS 5,635,813 A 6/1997 Shiga et al.
2002/0070707 A1 6/2002 Sato
(Continued)

FOREIGN PATENT DOCUMENTS

CN 110024208 A 7/2019
JP H07-176333 A 7/1995
(Continued)

OTHER PUBLICATIONS

Office Action, dated Jul. 8, 2023, issued in corresponding CN Application No. 202080027487.6.
(Continued)

*Primary Examiner* — Drew A Dunn
*Assistant Examiner* — Manuel Hernandez
(74) *Attorney, Agent, or Firm* — Morgan, Lewis & Bockius LLP

(57) ABSTRACT

A battery management apparatus includes: a communication unit configured to receive first state information including at least one of voltage, current and temperature of a first battery module connected to an external device from the external device; a measuring unit configured to measure at least one of voltage, current and temperature of a second battery module connected thereto; and a control unit configured to receive the first state information from the communication unit, receive second state information including at least one of voltage, current and temperature of the second battery module from the measuring unit, determine whether it is necessary to replace at least one of the first battery module and the second battery module based on the first state information and the second state information, and output an alarm code corresponding to the determination result.

14 Claims, 8 Drawing Sheets

(51) Int. Cl.

| | |
|---|---|
| ***G01R 31/392*** | (2019.01) |
| ***H01M 10/42*** | (2006.01) |
| ***H01M 10/44*** | (2006.01) |
| ***H01M 10/48*** | (2006.01) |
| ***H02J 7/42*** | (2026.01) |
| ***H02J 7/50*** | (2026.01) |
| ***H02J 7/60*** | (2026.01) |
| ***H02J 7/80*** | (2026.01) |
| ***H02J 7/82*** | (2026.01) |
| ***H02J 7/84*** | (2026.01) |

(52) U.S. Cl.

CPC ... *H01M 10/4207* (2013.01); *H01M 10/4257* (2013.01); *H01M 10/441* (2013.01); *H01M 10/482* (2013.01); *H01M 10/486* (2013.01); *H02J 7/42* (2026.01); *H02J 7/50* (2026.01); *H02J 7/685* (2026.01); *H02J 7/80* (2026.01); *H02J 7/82* (2026.01); *H02J 7/84* (2026.01); *H01M 2010/4271* (2013.01); *H01M 2010/4278* (2013.01)

(58) Field of Classification Search

CPC .. H02J 7/0048; H02J 7/005; H02J 7/40; H02J 7/42; H02J 7/50; H02J 7/685; H02J 7/80; H02J 7/82; H02J 7/84; G01R 31/382; G01R 31/392; H01M 10/4207; H01M 10/4257; H01M 10/441; H01M 10/482; H01M 10/486; H01M 2010/4271; H01M 2010/4278

USPC .......................................................... 320/136

See application file for complete search history.

(56) References Cited

U.S. PATENT DOCUMENTS

| | | | | |
|---|---|---|---|---|
| 2006/0054822 | A1 * | 3/2006 | Tsuchino | G01T 1/2006 250/336.1 |
| 2009/0212738 | A1 * | 8/2009 | Coonan | H02J 7/0013 320/113 |
| 2010/0036626 | A1 * | 2/2010 | Kang | G01R 31/392 702/63 |
| 2012/0299548 | A1 * | 11/2012 | Takahashi | H01M 50/51 320/117 |
| 2013/0093383 | A1 | 4/2013 | Kim et al. | |
| 2015/0323610 | A1 | 11/2015 | Ahn et al. | |
| 2016/0270629 | A1 | 9/2016 | Kasumi et al. | |
| 2016/0332531 | A1 | 11/2016 | Chazal et al. | |
| 2019/0181509 | A1 | 6/2019 | Ohtsuka et al. | |
| 2019/0273293 | A1 | 9/2019 | Kim et al. | |
| 2019/0386266 | A1 * | 12/2019 | Vecchio | H02J 7/0045 |
| 2025/0346147 | A1 * | 11/2025 | Choi | B60L 53/80 |

FOREIGN PATENT DOCUMENTS

| | | | | |
|---|---|---|---|---|
| JP | 2000-133318 | A | 5/2000 | |
| JP | 2001-282401 | A | 10/2001 | |
| KR | 10-0619743 | B1 | 9/2006 | |
| KR | 10-2013-0040575 | A | 4/2013 | |
| KR | 10-2013-0132343 | A | 12/2013 | |
| KR | 10-2015-0128160 | A | 11/2015 | |
| KR | 10-2016-0043369 | A | 4/2016 | |
| KR | 10-2016-0072743 | A | 6/2016 | |
| KR | 10-2016-0110409 | A | 9/2016 | |
| KR | 10-1672314 | B1 | 11/2016 | |
| KR | 10-1852664 | B1 | 4/2018 | |
| KR | 10-2018-0087544 | A | 8/2018 | |
| WO | WO-2013018888 | A1 * | 2/2013 | H01M 10/482 |
| WO | 2019/017282 | A1 | 1/2019 | |

OTHER PUBLICATIONS

Office Action dated Sep. 12, 2022, issued by the Japanese Patent Office in corresponding Japanese Patent Application No. 2021-552660.

International Search Report issued in corresponding International Patent Application No. PCT/KR2020/012511 dated Dec. 18, 2020.

Extended European Search Report dated Jun. 1, 2022, issued by the European Patent Office in corresponding European Patent Application No. 20865843.5.

* cited by examiner

BATTERY MANAGEMENT APPARATUS AND METHOD, AND BATTERY SYSTEM INCLUDING DETERMINING WHETHER TO REPLACE FIRST AND SECOND BATTERY MODULES

TECHNICAL FIELD

The present application claims priority to Korean Patent Application No. 10-2019-0116254 filed on Sep. 20, 2019 in the Republic of Korea, the disclosures of which are incorporated herein by reference.

The present disclosure relates to a battery management apparatus and method, and a battery system including the same, and more particularly, to a battery management apparatus and method for improving use efficiency of a battery module, and a battery system including the same.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel hydrogen batteries, nickel-zinc batteries, lithium batteries and the like. Among them, the lithium batteries are in the limelight since they have almost no memory effect compared to nickel-based batteries and also have very low self-charging rate and high energy density.

However, there is a problem in that the lithium battery may degrade as charging or discharging proceeds. That is, when a plurality of lithium batteries are provided, if the number of times of using each of the plurality of lithium batteries is not properly adjusted, the degrees of degradation of the plurality of lithium batteries become different, so that a performance deviation may occur between the plurality of lithium batteries.

Therefore, in order to solve this problem, conventionally, a battery management apparatus for determining a battery replacement timing based on the most degraded battery cell among the plurality of battery cells has been disclosed (Patent Document 1).

That is, Patent Document 1 discloses a configuration in which, if any battery cell is degraded over a certain level, the corresponding battery cell is replaced only with a new battery cell.

However, Patent Document 1 only discloses a configuration for determining the replacement timing of a battery cell based on the degradation state of the battery cell that is most degraded, but does not disclose a configuration for improving the use efficiency of a plurality of battery cells while minimizing performance deviation at all.

(Patent Document 1) KR 10-2015-0128160 A

DISCLOSURE

Technical Problem

The present disclosure is designed to solve the problems of the related art, and therefore the present disclosure is directed to providing a battery management apparatus and method for improving the use efficiency of a plurality of battery modules by minimizing performance deviation of the plurality of battery modules, and a battery system including the same.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a battery management apparatus, comprising: a communication unit configured to receive first state information including at least one of voltage, current and temperature of a first battery module connected to an external device from the external device; a measuring unit configured to measure at least one of voltage, current and temperature of a second battery module connected thereto; and a control unit configured to receive the first state information from the communication unit, receive second state information including at least one of voltage, current and temperature of the second battery module from the measuring unit, determine whether it is necessary to replace at least one of the first battery module and the second battery module based on the first state information and the second state information, and output an alarm code corresponding to the determination result.

The control unit may be configured to determine whether it is necessary to replace at least one of the first battery module and the second battery module, only when the first battery module is connected to the external device and the second battery module is connected to the measuring unit.

The control unit may be configured to estimate at least one of rest period, SOC and SOH of the first battery module based on the first state information, and determine whether it is possible to discharge the second battery module and estimate at least one of rest period, SOC and SOH of the second battery module based on the second state information.

The control unit may be configured to subsequently perform: a first determining operation of determining the replacement necessity based on the state of the first battery module and the state of the second battery module; a second determining operation of determining the replacement necessity based on the rest period of the first battery module and the rest period of the second battery module; a third determining operation of determining the replacement necessity based on the SOC of the first battery module and the SOC of the second battery module; and a fourth determining operation of determining the replacement necessity based on the SOH of the first battery module and the SOH of the second battery module.

In the first determining operation, the control unit may be configured to determine whether or not to replace at least one of the first battery module and the second battery module with a new battery module, based on the state of the first battery module and the state of the second battery module.

In the second determining operation, the control unit may be configured to output a second alarm code to notify that it is necessary to replace the first battery module and the second battery module with each other, when the rest period of the first battery module is smaller than a reference rest period but the rest period of the second battery module is equal to or greater than the reference rest period, and in the second determining operation, the control unit may be configured to perform the third determining operation, when the rest periods of both the first battery module and the second battery module are smaller than the reference rest period.

In the third determining operation, the control unit may be configured to output a third alarm code to notify that it is necessary to replace the first battery module and the second battery module with each other, when the SOC of the second battery module is equal to or greater than a reference SOC and the SOC of the first battery module is smaller than the SOC of the second battery module, and in the third determining operation, the control unit may be configured to perform the fourth determining operation, when the SOC of the second battery module is equal to or greater than the reference SOC and the SOC of the first battery module is equal to or greater than the SOC of the second battery module.

In the fourth determining operation, the control unit may be configured to output a fourth alarm code to notify that it is necessary to replace the first battery module, when the SOH of the first battery module is smaller than the SOH of the second battery module.

The control unit may be configured to determine the replacement necessity again, after a predetermined time passes from the determination of the replacement necessity.

The control unit may be configured to change the predetermined time, when the external device and the battery management apparatus are connected to each other.

In another aspect of the present disclosure, there is also provided a battery management method comprising: a connection state determining step of determining a connection state between a first battery module and an external device and a connection state between a second battery module and a measuring unit; a first determining step of determining whether it is possible to discharge the second battery module, when the first battery module is connected to the external device and the second battery module is connected to the measuring unit; a second determining step of determining whether it is necessary to replace at least one of the first battery module and the second battery module based on a rest period of the first battery module and a rest period of the second battery module, when being determined in the first determining step that it is possible to discharge the second battery module; a third determining step of determining the replacement necessity based on a SOC of the first battery module and a SOC of the second battery module, when being determined in the second determining step that it is not necessary to replace the first battery module and the second battery module; and a fourth determining step of determining the replacement necessity based on a SOH of the first battery module and a SOH of the second battery module, when being determined in the third determining step that it is not necessary to replace the first battery module and the second battery module.

In still another aspect of the present disclosure, there is also provided a battery system, comprising a first device and a second device attachable to and detachable from each other.

The first device may be configured to, when a first battery module is connected thereto, measure at least one of voltage, current and temperature of the first battery module and transmit first state information including at least one of the measured voltage, current and temperature of the first battery module to the second device.

The second device may be configured to, when a second battery module is connected thereto, measure at least one of voltage, current and temperature of the second battery module, determine whether it is necessary to replace at least one of the first battery module and the second battery module based on second state information including at least one of the measured voltage, current and temperature of the second battery module and the first state information received from the first device, and output an alarm code corresponding to the determination result.

In the battery system according to still another aspect of the present disclosure, at least one of the first device and the second device may further include an alarm unit configured to receive the alarm code output from the second device and output an alarm corresponding to the received alarm code.

The first battery module may be configured to be replaceable with the second battery module.

Advantageous Effects

According to an aspect of the present disclosure, there is an advantage in that the performance deviation of the first battery module and the second battery module may be minimized. Therefore, the use efficiency of the first battery module and the second battery module may be improved.

In addition, according to an aspect of the present disclosure, since an alarm code corresponding to the determination result of whether it is necessary to replace the first battery module and the second battery module is output, the replacement necessity information of the first battery module and the second battery module may be provided more specifically.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
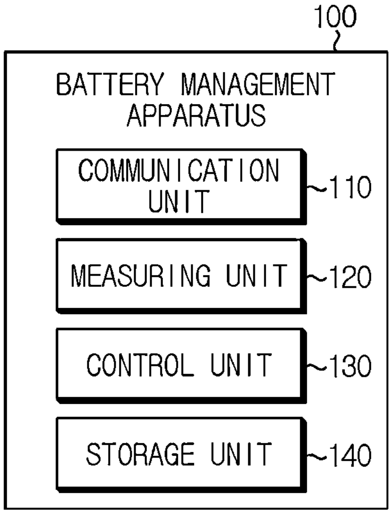
FIG. 1 is a diagram schematically showing a battery management apparatus according to an embodiment of the present disclosure.
Figure 2:
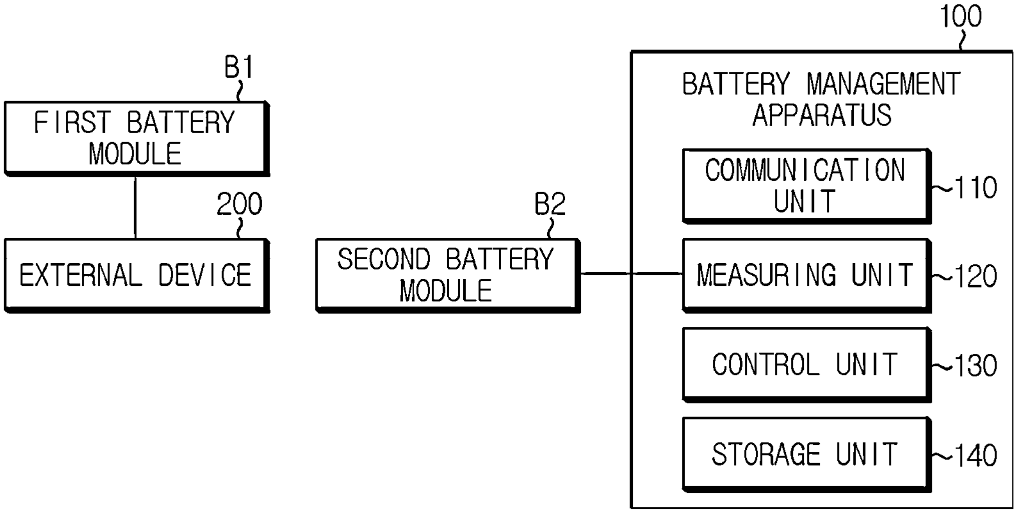
FIG. 2 is a diagram schematically showing the battery management apparatus according to an embodiment of the present disclosure and an external device.

FIG. 1 is a diagram schematically showing a battery management apparatus 100 according to an embodiment of the present disclosure. FIG. 2 is a diagram schematically showing the battery management apparatus 100 according to an embodiment of the present disclosure and an external device 200.

Referring to FIG. 1, the battery management apparatus 100 according to an embodiment of the present disclosure may include a communication unit 110, a measuring unit 120, and a control unit 130.

The battery module described below refers to a cell assembly including one battery cell or a plurality of battery cells connected to each other in series and/or parallel.

The communication unit 110 may be configured to receive first state information including at least one of voltage, current and temperature of a first battery module B1 connected to an external device 200 from the external device 200.

The external device 200 is a device located outside the battery management apparatus 100 and may be a device capable of communicating with the battery management apparatus 100 by wire or wirelessly.

For example, one of the external device 200 and the battery management apparatus 100 may be included in a portable device, and the other may be included in a fixed device. Conversely, both the external device 200 and the battery management apparatus 100 may be portable devices or may be included in a fixed device. Accordingly, the external device 200 and the battery management apparatus 100 may be separated from each other or may be connected.

In addition, the communication unit 110 and the external device 200 may communicate with each other by wire and/or wirelessly. For example, the communication unit 110 and the external device 200 may be connected to each other through a wireless communication channel capable of transmitting and receiving data. In addition, the communication unit 110 and the external device 200 may be connected to each other through a wired line capable of transmitting and receiving data.

Referring to FIG. 2, a first battery module B1 may be connected to the external device 200. That is, the first battery module B1 may be attached to and detached from the external device 200. If the first battery module B1 is mounted to the external device 200, the external device 200 may receive power for operation from the first battery module B1. Also, if the first battery module B1 is connected to the external device 200, the external device 200 may measure at least one of voltage, current and temperature of the first battery module B1. In addition, the external device 200 may transmit first state information including the measured information to the communication unit 110.

The communication unit 110 may receive the first state information from the external device 200 and transmit the received first state information to the control unit 130.

The measuring unit 120 may be configured to measure at least one of voltage, current and temperature of a second battery module B2 connected thereto.

Referring to FIG. 2, the second battery module B2 may be connected to the battery management apparatus 100. That is, the second battery module B2 may be attached to and detached from the battery management apparatus 100. If the second battery module B2 is connected to the battery management apparatus 100, the measuring unit 120 may measure at least one of voltage, current and temperature of the second battery module B2.

For example, the measuring unit 120 may measure a positive electrode potential and a negative electrode potential of the second battery module B2. In addition, the measuring unit 120 may measure the voltage of the second battery module B2 by calculating a potential difference between the measured positive electrode potential and the measured negative electrode potential of the second battery module B2.

In addition, the measuring unit 120 may measure a charge and discharge current of the second battery module B2. For example, the measuring unit 120 may measure the current output from the second battery module B2 or applied to the second battery module B2.

In addition, the measuring unit 120 may measure the temperature of the second battery module B2 using a temperature sensor or the like.

The control unit 130 may be configured to receive the first state information from the communication unit 110.

For example, the control unit 130 and the communication unit 110 are provided inside the battery management apparatus 100 and connected to each other. In addition, the control unit 130 may receive the first state information from the communication unit 110. Accordingly, the control unit 130 may receive the first state information from the external device 200 through the communication unit 110.

In addition, the control unit 130 may be configured to receive second state information including at least one of voltage, current and temperature of the second battery module B2 from the measuring unit 120.

For example, the control unit 130 and the measuring unit 120 are provided in the battery management apparatus 100 and connected to each other. Here, the communication unit 110 and the measuring unit 120 may be connected to the control unit 130 through different lines. The control unit 130 may receive the second state information including at least one of voltage, current and temperature of the second battery module B2 measured by the measuring unit 120.

Here, the first state information and the second state information may correspond to each other. That is, the first state information may be information including at least one of voltage, current and temperature of the first battery module B1, and the second state information may be information including at least one of voltage, current and temperature of the second battery module B2.

For example, the first state information may include voltage, current and temperature information of the first battery module B1, and the second state information may include voltage, current and temperature information of the second battery module B2.

The control unit 130 may be configured to determine whether it is necessary to replace at least one of the first battery module B1 and the second battery module B2, based on the first state information and the second state information.

Here, whether it is necessary to replace at least one of the first battery module B1 and the second battery module B2 may include whether it is necessary to replace the first battery module B1 and the second battery module B2 with each other. Preferably, the first battery module B1 and the second battery module B2 may be battery modules that are attachable to and detachable from the external device 200 and the battery management apparatus 100. That is, the first battery module B1 and the second battery module B2 may be compatible products.

That is, the first battery module B1 and the second battery module B2 do not refer to specific battery modules, but refer to battery modules that are connected to or can be connected to the external device 200 or the battery management apparatus 100.

For example, if an X battery module is connected to the external device 200 and a Y battery module is connected to the battery management apparatus 100, the X battery module may be the first battery module B1, and the Y battery module may be the second battery module B2. Here, if the X battery module and the Y battery module are replaced with each other, the X battery module may be connected to the battery management apparatus 100, and the Y battery module may be connected to the external device 200. In this case, the Y battery module may be referred to as the first battery module B1, and the X battery module may be referred to as the second battery module B2.

In addition, if the X battery module is connected to the external device 200 but the Y battery module is not connected to the battery management apparatus 100, the X battery module may be the first battery module B1, and the Y battery module may be the second battery module B2.

In addition, whether it is necessary to replace at least one of the first battery module B1 and the second battery module B2 may include whether it is necessary to replace at least one of the first battery module B1 and the second battery module B2 with a new battery module.

The control unit 130 may determine the replacement necessity of the battery module based on the first state information and the second state information. That is, the control unit 130 may check the state information of the first battery module B1 and the state information of the second battery module B2 and determine whether it is necessary to replace at least one of the first battery module B1 and the second battery module B2 based on the checked result.

In addition, the control unit 130 may be configured to output an alarm code corresponding to the determination result.

For example, as a determination result on the replacement necessity, the control unit 130 may determine that it is necessary to replace the first battery module B1 and the second battery module B2 with each other, or that it is necessary to replace the first battery module B1 or the second battery module B2 with a new battery module. That is, the control unit 130 may derive various determination results on the replacement necessity based on the first state information and the second state information.

Therefore, the control unit 130 may output an alarm code corresponding to various derived determination results. Accordingly, the contents of each determination result determined by the control unit 130 may be output through a corresponding alarm code. For example, a user may clearly recognize the replacement necessity of the first battery module B1 and/or the second battery module B2 by checking the alarm code output by the control unit 130.

That is, the battery management apparatus 100 has an advantage of providing the replacement necessity of the first battery module B1 and/or the second battery module B2 based on the second state information for the connected second battery module B2 and the first state information for the first battery module B1 provided in the external device 200. Accordingly, there is an advantage in that the deviation of performance of the first battery module B1 and the second battery module B2 is minimized, so that the period of use of the first battery module B1 and the second battery module B2 may be increased.

Here, the control unit 130 provided to the battery management apparatus 100 may selectively include processors known in the art, application-specific integrated circuit (ASIC), other chipsets, logic circuits, registers, communication modems, data processing devices, and the like to execute various control logic performed in the present disclosure. Also, when the control logic is implemented in software, the control unit 130 may be implemented as a set of program modules. At this time, the program module may be stored in a memory and executed by the control unit 130. The memory may be located inside or out of the control unit 130 and may be connected to the control unit 130 by various well-known means.

In addition, referring to FIGS. 1 and 2, the battery management apparatus 100 according to an embodiment of the present disclosure may further include a storage unit 140. The storage unit 140 may store programs, data, and the like necessary for the control unit 130 to determine the replacement necessity. That is, the storage unit 140 may store data necessary for operation and function of each component of the battery management apparatus 100, data generated in the process of performing the operation or function, or the like. The storage unit 140 is not particularly limited in its kind as long as it is a known information storage means that can record, erase, update and read data. As an example, the information storage means may include RAM, flash memory, ROM, EEPROM, registers, and the like. In addition, the storage unit 140 may store program codes in which processes executable by the control unit 130 are defined.

Meanwhile, the control unit 130 may configured to determine whether it is necessary to replace at least one of the first battery module B1 and the second battery module B2, only when the first battery module B1 is connected to the external device 200 and the second battery module B2 is connected to the measuring unit 120.

That is, if the first battery module B1 is connected to the external device 200 and the second battery module B2 is connected to the measuring unit 120, the control unit 130 may determine the replacement necessity.

In addition, as described above, the first battery module B1 and the second battery module B2 are compatible battery modules. Accordingly, the control unit 130 may also determine the replacement necessity even when the second battery module B2 is connected to the external device 200 and the first battery module B1 is connected to the measuring unit 120.

The control unit 130 may determine whether it is necessary to replace at least one of the first battery module B1 and the second battery module B2, based on the first state information for the first battery module B1 and the second state information for the second battery module B2. Accordingly, the control unit 130 may determine the replacement necessity only when the first battery module B1 and the second battery module B2 are connected to the external device 200 and the measuring unit 120 one by one.

The battery management apparatus 100 has an advantage of more accurately diagnosing whether it is necessary to replace the first battery module B1 and/or the second battery module B2 by comparing the first state information of the first battery module B1 with the second state information of the second battery module B2.

The control unit 130 may be configured to estimate at least one of a rest period, SOC (State of Charge) and SOH (SOH, State of Health) of the first battery module B1 based on the first state information.

Here, the rest period may mean a continuous period during which the voltage of the battery module is maintained above a predetermined voltage. For example, the rest period of the first battery module B1 may mean a period during which the voltage of the first battery module B1 is maintained above the predetermined voltage. Preferably, the rest period of the first battery module B1 may mean a period during which the voltage of the first battery module B1 is maintained above 4.0 [V].

The control unit 130 may check voltage information of the first battery module B1 based on the first state information received from the communication unit 110. In addition, the control unit 130 may estimate the rest period of the first battery module B1 by comparing the checked voltage of the first battery module B1 with the predetermined voltage.

The control unit 130 may check voltage information and temperature information of the first battery module B1 based on the first state information received from the communication unit 110. The control unit 130 may estimate the SOC of the first battery module B1 based on the checked voltage of the first battery module B1. In addition, the control unit 130 may also estimate the SOC of the first battery module B1 based on the checked voltage and temperature of the first battery module B1. Here, SOC is a relative ratio of a charge capacity remaining at the present to a full charge capacity of the battery module.

The control unit 130 may refer to a look-up table stored in the storage unit 140 in order to estimate the SOC of the first battery module B1 from the first state information. For example, the storage unit 140 may store a voltage-SOC look-up table in which voltage and SOC are mapped to each other. In addition, the storage unit 140 may store a temperature-voltage-SOC look-up table in which voltage, temperature and SOC are mapped to each other. Accordingly, the control unit 130 may estimate the SOC of the first battery module B1 from the first state information by referring to the voltage-SOC look-up table or the temperature-voltage-SOC look-up table stored in the storage unit 140.

Meanwhile, the control unit 130 may check current information of the first battery module B1 based on first state information. For example, the control unit 130 may estimate the SOC of the first battery module B1 by integrating the checked current of the first battery module B1 according to time.

Also, the control unit 130 may estimate the SOH of the first battery module B1 based on the first state information of the first battery module B1. Here, SOH quantitatively indicates the degree of degradation of the battery module. The control unit 130 may estimate the SOH of the first battery module B1 by comparing a full charge capacity at the time of shipment of the first battery module B1 with a full charge capacity of the first battery module B1 at the present. In addition, the control unit 130 may also estimate the SOH of the first battery module B1 by comparing a resistance at the time of shipment of the first battery module B1 with a resistance of the first battery module B1 at the present. In this case, the full charge capacity and resistance when the first battery module B1 is shipped may be stored in the storage unit 140.

In addition, the control unit 130 may be configured to estimate at least one of rest period, SOC and SOH of the second battery module B2 based on the second state information.

That is, similar to estimating at least one of rest period, SOC and SOH of the first battery module B1 based on the first state information, the control unit 130 may estimate at least one of rest period, SOC and SOH of the second battery module B2 based on the second state information. In this case, the full charge capacity and resistance when the second battery module B2 is shipped may be stored in the storage unit 140.

In addition, the control unit 130 may be configured to determine whether it is possible to discharge the second battery module B2, based on the second state information.

For example, the control unit 130 may determine whether the state of the second battery module B2 is a discharge protection state and determine whether it is possible to discharge the second battery module B2. Here, the discharge protection state may be a state in which it is not recommended to discharge the second battery module B2. That is, if the state of the second battery module B2 is the discharge protection state, the control unit 130 may determine that the state of the second battery module B2 is a discharge-impossible state.

The control unit 130 may check the temperature of the second battery module B2 based on the second state information of the second battery module B2. In addition, the control unit 130 may determine whether the state of the second battery module B2 is the discharge protection state by comparing the temperature of the second battery module B2 with a preset discharge-possible maximum temperature.

For example, it is assumed that a maximum discharge temperature of the battery module is set to 60° C. If the temperature of the second battery module B2 exceeds 60° C., the control unit 130 may determine that the state of the second battery module B2 is the discharge protection state. That is, the control unit 130 may determine that the state of the second battery module B2 is a discharge-impossible state. Conversely, if the temperature of the second battery module B2 is lower than 60° C., the control unit 130 may determine that the state of the second battery module B2 is a discharge-possible state.

That is, the battery management apparatus 100 may estimate at least one of the rest period, SOC and SOH of the first battery module B1 connected to the external device 200 as well as the second battery module B2 directly connected to the measuring unit 120.

Accordingly, since the state information of the first battery module B1 and the second battery module B2 is continuously compared, there is an advantage that a performance deviation between the first battery module B1 and the second battery module B2 may be minimized. That is, the performance imbalance between the first battery module B1 and the second battery module B2 is resolved, and ultimately, the use period of the first battery module B1 and the second battery module B2 may be increased.

Hereinafter, an operation of the control unit 130 to determine whether it is necessary to replace at least one of the first battery module B1 and the second battery module B2 will be described in detail with reference to FIGS. 3, 4 and 5.

Figure 3:
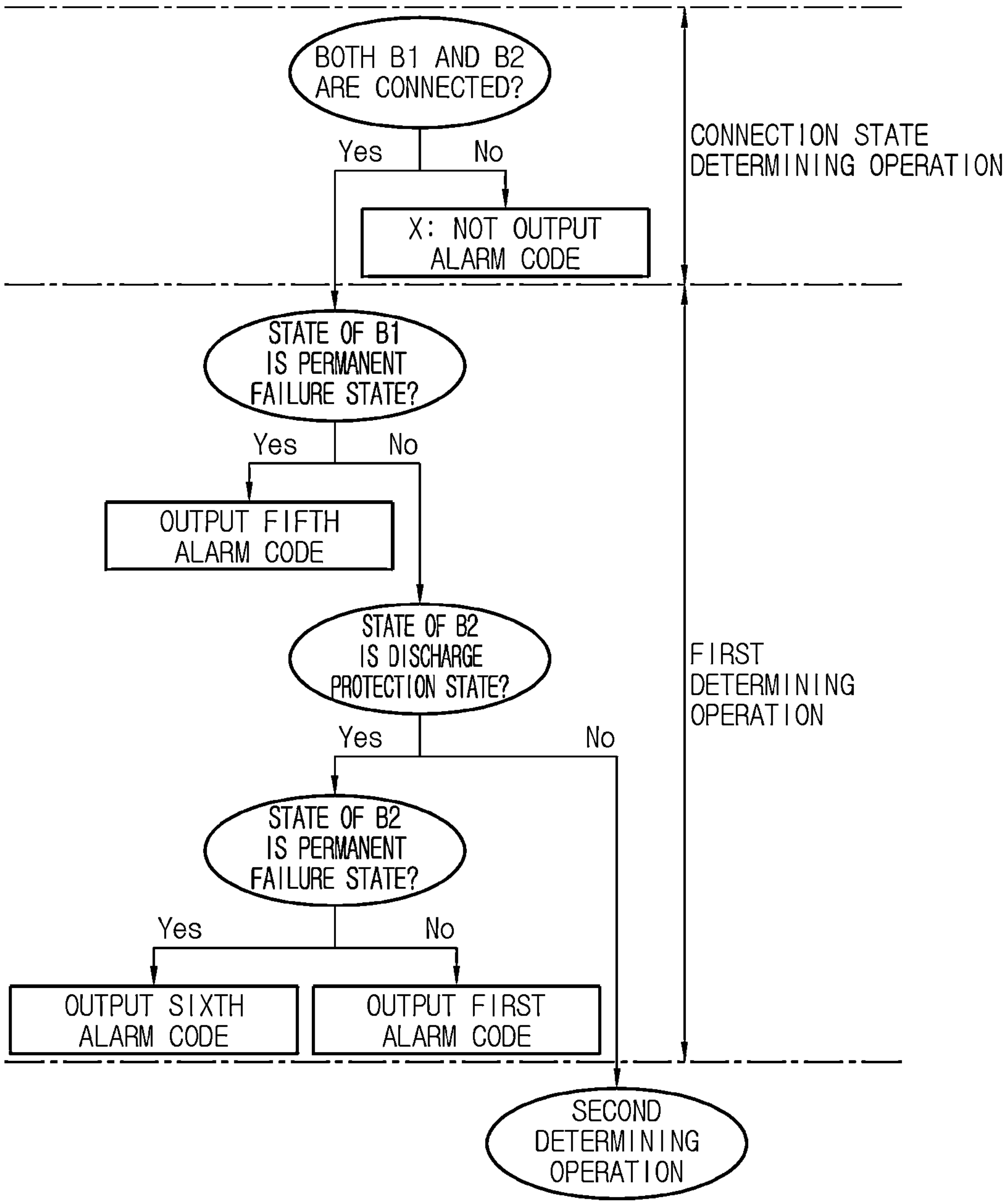
FIGS. 3 to 5 are diagrams schematically showing a determining operation of the battery management apparatus according to an embodiment of the present disclosure.
Figure 4:
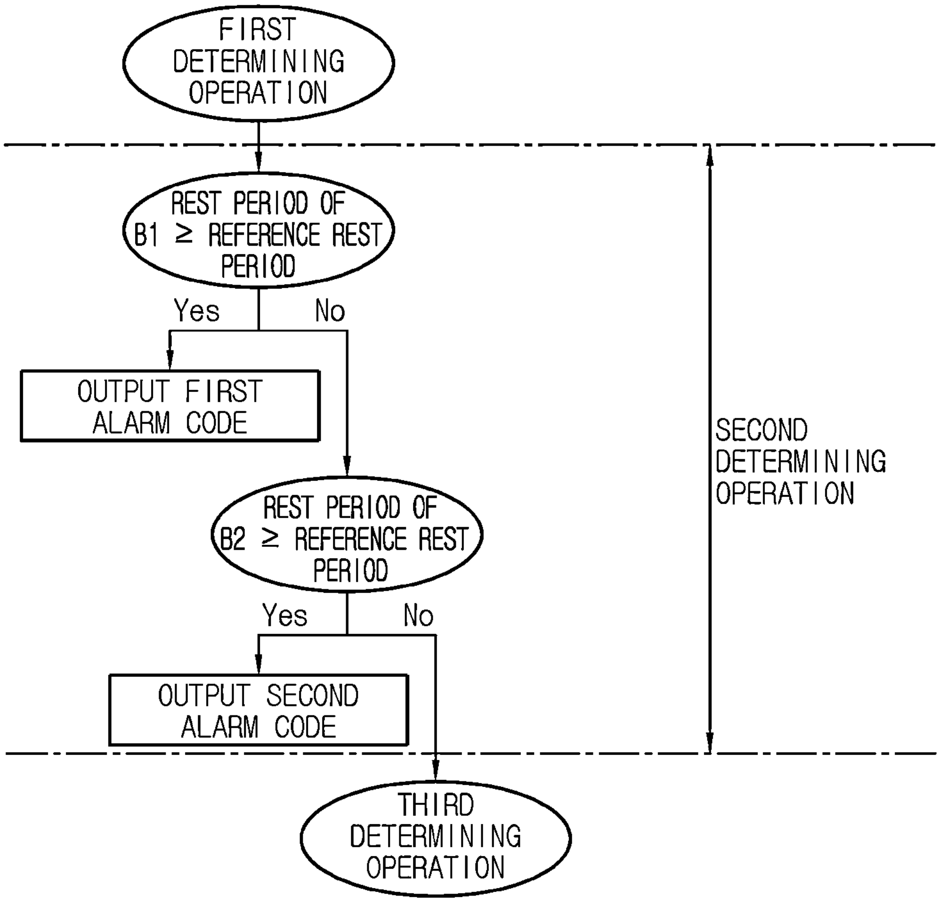
Figure 5:
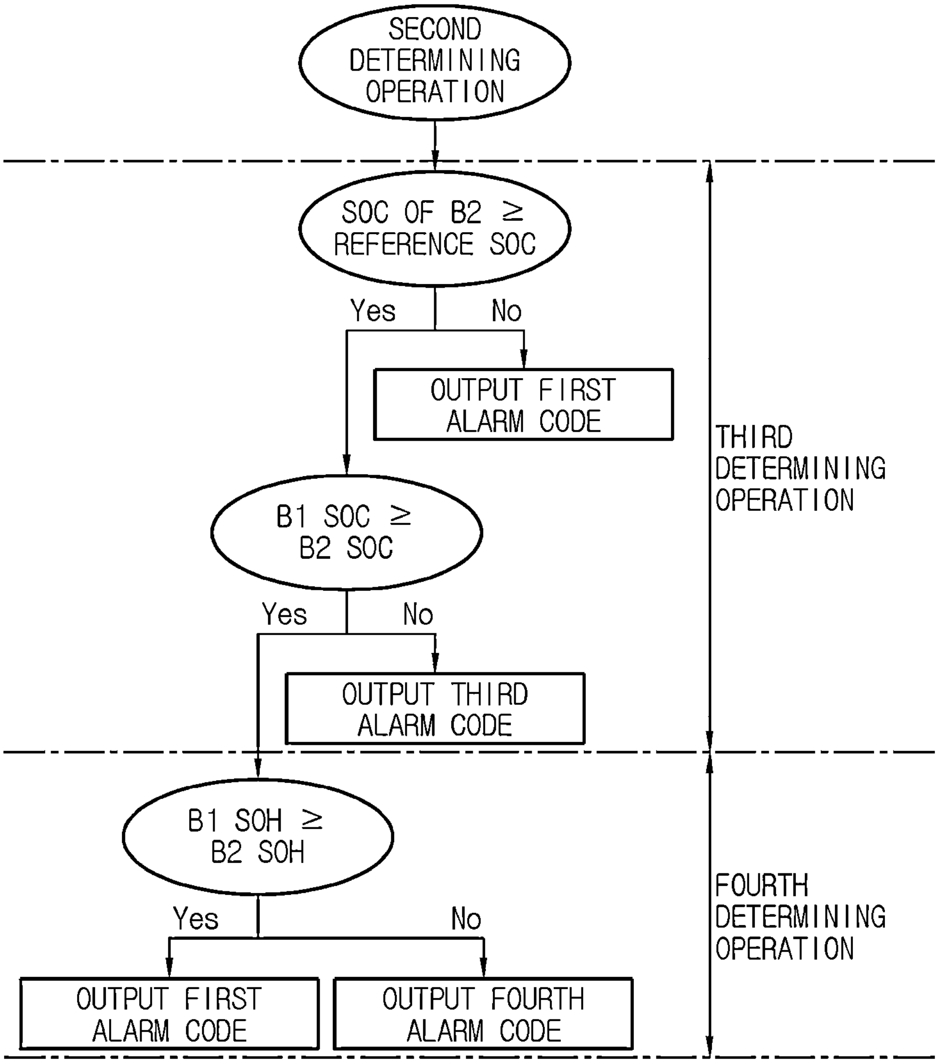

FIGS. 3 to 5 are diagrams schematically showing a determining operation of the battery management apparatus 100 according to an embodiment of the present disclosure.

Referring to FIGS. 3 to 5, the control unit 130 may sequentially perform a connection state determining operation, a first determining operation, a second determining operation, a third determining operation, and a fourth determining operation. That is, the control unit 130 may determine whether it is necessary to replace at least one of the first battery module B1 and the second battery module B2 in each operation.

Here, the order of the plurality of determining operations may be set to minimize the performance degradation deviation of the first battery module B1 and the second battery module B2. That is, the order of the plurality of determining operations may be set so that the first battery module B1 and the second battery module B2 may be used more efficiently.

The control unit 130 may be configured to output the following alarm codes while performing the plurality of determining operations.

TABLE 1

| Alarm code | Content of alarm |
|---|---|
| First alarm code C1 | Not necessary to replace the first battery module B1 and the second battery module B2 |
| Second alarm code C2 | Not necessary to replace the first battery module B1 and the second battery module B2 with each other<br>Recommended to separate the second battery module B2 from the battery management apparatus 100 |
| Third alarm code C3 | Necessary to replace the first battery module B1 and the second battery module B2 with each other |
| Fourth alarm code C4 | Necessary to replace the first battery module B1 and the second battery module B2 with each other<br>Necessary to replace the first battery module B1 with a new battery module |
| Fifth alarm code C5 | Necessary to replace the first battery module B1 with a new battery module |
| Sixth alarm code C6 | Necessary to replace the second battery module B2 with a new battery module |

Referring to Table 1, the control unit 130 may output any one of a first alarm code C1, a second alarm code C2, a third alarm code C3, a fourth alarm code C4, a fifth alarm code C5 and a sixth alarm code C6 according to the determination results in the first determining operation, the second determining operation, the third determining operation and the fourth determining operation. For example, if the first alarm code C1 is output from the control unit 130, the battery management apparatus 100 and/or the external device 200 may not output an alarm related to replacement of the first battery module B1 and the second battery module B2.

Since the alarm codes output from the control unit 130 contain different alarm contents, respectively, an alarm corresponding to the alarm code output from the control unit 130 may be output from the battery management apparatus 100 and/or the external device 200. Accordingly, a user may easily identify the state of the first battery module B1 and/or the second battery module B2 by checking the output alarm.

Hereinafter, with reference to FIGS. 3 to 5 and Table 1, the operation state of the control unit 130 will be described in detail.

First, the control unit 130 may perform the connection state determining operation to determine whether both the first battery module B1 and the second battery module B2 are connected.

That is, the control unit 130 may determine whether the first battery module B1 and the second battery module B2 are connected to the external device 200 and the measuring unit 120 one by one by performing the connection state determining operation.

For example, if the first battery module B1 is not connected, the external device 200 is not able to measure at least one of voltage, current and temperature of the first battery module B1. In this case, the external device 200 is not able to transmit the first state information to the communication unit 110.

In addition, if the second battery module B2 is not connected to the battery management apparatus 100, the measuring unit 120 is not able to measure at least one of voltage, current and temperature of the second battery module B2.

Accordingly, the control unit 130 may determine the connection state of the first battery module B1 based on whether the first state information is received from the communication unit 110. Also, the control unit 130 may determine the connection state of the second battery module B2 based on whether the second state information is received from the measuring unit 120.

The control unit 130 may perform the first determining operation only when the first battery module B1 and the second battery module B2 are connected to the external device 200 or the measuring unit 120, respectively.

If any one of the first battery module B1 and the second battery module B2 is not connected to the external device 200 or the measuring unit 120, the control unit 130 may not output an alarm code and may not perform the first determining operation.

Next, the control unit 130 may perform the first determining operation to determine the replacement necessity based on the states of the first battery module B1 and the second battery module B2. That is, the control unit 130 may determine whether or not to replace at least one of the first battery module B1 and the second battery module B2 with a new battery module, based on the states of the first battery module B1 and the second battery module B2.

Preferably, if it is determined that both the first battery module B1 and the second battery module B2 are connected in the connection state determining operation, the control unit 130 may perform the first determining operation. The control unit 130 may determine whether it is necessary to replace the first battery module B1 and the second battery module B2 by performing the first determining operation.

First, the control unit 130 may check the state of the first battery module B1. For example, if the state of the first battery module B1 is a failure state, the control unit 130 may output the fifth alarm code C5. Preferably, if the checked state of the first battery module B1 is a permanent failure state, the control unit 130 may output the fifth alarm code C5.

For example, the control unit 130 may diagnose the state of the first battery module B1 as a failure state by checking the temperature of the first battery module B1 from the first state information of the first battery module B1. If the temperature of the first battery module B1 is higher than a preset temperature, the control unit 130 may diagnose the state of the first battery module B1 as a failure state. Here, the preset temperature is a temperature that exceeds an available temperature range of the battery module, and may be preset to prevent the risk of explosion or fire of the battery module. For example, an upper limit of the available temperature range may be set to 60° C., and the preset temperature may be set to 90° C.

That is, if the state of the first battery module B1 is determined as a permanent failure state, the control unit 130 may output the fifth alarm code C5 including a content that it is necessary to replace the first battery module B1 with a new battery module.

As another example, the control unit 130 may also diagnose the state of the first battery module B1 as a failure state by checking the voltage of the first battery module B1 from the first state information of the first battery module B1. For example, if the voltage of the first battery module B1 is less than a preset lowest voltage, the control unit 130 may diagnose the state of the first battery module B1 as a failure state. Here, the preset lowest voltage is a voltage less than an available voltage range of the battery module, and may be set to 2 V, for example.

If it is determined that the state of the first battery module B1 is not a failure state in the first determining operation, the control unit 130 may determine the state of the second battery module B2. That is, the control unit 130 may be configured to determine the state of the second battery module B2 based on whether the state of the first battery module B1 is a failure state in the first determining operation.

First, if the state of the first battery module B1 is not a failure state, the control unit 130 may be configured to determine whether the state of the second battery module B2 is a discharge protection state.

For example, if the temperature of the second battery module B2 checked by the control unit 130 exceeds a maximum discharge temperature (for example, 60° C.), the control unit 130 may determine the state of the second battery module B2 as a discharge protection state. Preferably, the maximum discharge temperature may be set equal to the upper limit of the available temperature range of the battery module.

In addition, if the state of the second battery module B2 is determined as a discharge protection state, the control unit 130 may diagnose whether the state of the second battery module B2 is a failure state.

Similar to diagnosing the state of the first battery module B1, the control unit 130 may diagnose the state of the second battery module B2 based on the second state information of the second battery module B2.

For example, if the temperature of the second battery module B2 is higher than the preset temperature (90° C.), the control unit 130 may determine the state of the second battery module B2 as a permanent failure state. In this case, the control unit 130 may output the sixth alarm code C6 including a content that it is necessary to replace the second battery module B2 with a new battery module.

Conversely, if the control unit 130 determines that the state of the second battery module B2 is a discharge protection state but is not a permanent failure state, the control unit 130 may determine the state of the second battery module B2 as a temporary failure state. In this case, the control unit 130 may output the first alarm code C1. For example, if the temperature of the second battery module B2 is higher than the maximum discharge temperature (60° C.) and lower than the preset temperature (90° C.), the control unit 130 may determine the state of the second battery module B2 as a temporary failure state.

That is, the control unit 130 may be configured to classify the state of the second battery module B2 into a state in which discharge is permanently impossible (a permanent failure state) and a state in which discharge is temporarily impossible (a temporary failure state).

Here, the temporary failure state means a state in which the battery module is not permanently in a failure state but temporarily in a failure state, in which the state of the battery module can be restored to a normal state as time passes. For example, if the temperature of the second battery module B2 is temporarily higher than the maximum discharge temperature (60° C.), the control unit 130 may determine the state of the second battery module B2 as a temporary failure state. In addition, by outputting the first alarm code C1, it is possible to provide a time during which the state of the second battery module B2 can be restored to a normal state.

That is, since the control unit 130 determines the state of the second battery module B2 by subdividing the state into a permanent failure state and a temporary failure state, the use efficiency of the second battery module B2 may be improved. That is, since it is not necessary to replace the second battery module B2 in a temporary failure state, the second battery module B2 may be used longer.

If it is determined that the state of the second battery module B2 is not a discharge protection state, the control unit 130 may perform the second determining operation.

Next, the control unit 130 may perform the second determining operation to determine the replacement necessity based on the rest period of the first battery module B1 and the rest period of the second battery module B2.

Preferably, if it is determined that the state of the second battery module B2 is not the discharge protection state in the first determining operation, the control unit 130 may perform the second determining operation.

The control unit 130 may perform the second determining operation to determine whether it is necessary to replace the first battery module B1 and the second battery module B2 with each other. That is, by the second determining operation, it may be determined whether the first battery module B1 and the second battery module B2 should be replaced with each other.

As described above, the rest period refers to a period during which the voltage of the battery module is maintained above a predetermined voltage.

First, the control unit 130 may estimate the rest period of the first battery module B1. That is, the control unit 130 may extract voltage information of the first battery module B1 from the first state information received from the communication unit 110, and compare the extracted voltage of the first battery module B1 with the predetermined voltage.

For example, if the predetermined voltage is preset to 4.0 [V], the control unit 130 may determine whether the voltage of the first battery module B1 is equal to or greater than 4.0 [V]. In addition, the control unit 130 may estimate the rest period of the first battery module B1 by calculating a continuous period during which the voltage of the first battery module B1 is equal to or greater than 4.0[V].

If the rest period of the first battery module B1 is greater than or equal to a reference rest period, the control unit 130 may output the first alarm code C1 and terminate the determination of the replacement necessity. That is, if the rest period of the first battery module B1 is greater than or equal to the reference rest period, the control unit 130 may output the first alarm code C1 including a content that it is not necessary to replace the first battery module B1 and the second battery module B2 with each other.

Here, the reference rest period is a preset period and may be a period stored in the storage unit 140 in advance. For example, the reference rest period may be set to 14 days.

Conversely, if the rest period of the first battery module B1 is less than the reference rest period, the control unit 130 may estimate the rest period of the second battery module B2. The rest period of the second battery module B2 may be estimated based on the second state information. If the rest period of the second battery module B2 is greater than or equal to the reference rest period, the control unit 130 may output the second alarm code C2 and terminate the determination of the replacement necessity.

Here, the second alarm code C2 may be an alarm code indicating that there is a high possibility that the first battery module B1 is used within the reference rest period, but there is a high possibility that the second battery module B2 is in a charged state and is not used within the reference rest period.

That is, the second alarm code C2 may include a content that the first battery module B1 and the second battery module B2 should be replaced with each other. In addition, the second alarm code C2 may contain an alarm content recommending that the second battery module B2 should be immediately separated from the battery management apparatus 100.

Therefore, if the rest period of the first battery module B1 is less than the reference rest period but the rest period of the second battery module B2 is equal to or greater than the reference rest period, the control unit 130 may output the second alarm code C2 notifying that it is necessary to replace the first battery module B1 and the second battery module B2 with each other. In addition, the control unit 130 may terminate the determination of the replacement necessity.

Conversely, if the rest periods of both the first battery module B1 and the second battery module B2 are smaller than the reference rest period, the control unit 130 may perform the third determining operation.

Next, the control unit 130 may perform the third determining operation to determine the replacement necessity based on the SOC of the first battery module B1 and the SOC of the second battery module B2.

Preferably, the control unit 130 may perform the third determining operation if it is determined in the second determining operation that the rest periods of both the first battery module B1 and the second battery module B2 are smaller than the reference rest period.

The control unit 130 may determine whether it is necessary to replace the first battery module B1 and the second battery module B2 with each other by performing the third determining operation. That is, by the third determining operation, it may be determined whether or not to replace the first battery module B1 and the second battery module B2 with each other.

First, the control unit 130 may estimate the SOC of the second battery module B2. That is, the control unit 130 may estimate the SOC of the second battery module B2 based on the second state information received from the measuring unit 120. In addition, the control unit 130 may compare the estimated SOC of the second battery module B2 with a reference SOC.

Here, the reference SOC may be set in advance as a lowest SOC suitable for the battery module, and may be stored in advance in the storage unit 140. For example, the reference SOC may be set according to the total capacity of the first battery module B1 and the second battery module B2. As a specific example, the reference SOC may be set to 50% in advance.

If the SOC of the second battery module B2 is smaller than the reference SOC, the control unit 130 may output the first alarm code C1. If the SOC of the second battery module B2 is smaller than the reference SOC, the SOC of the second battery module B2 may not be a suitable SOC for use. Therefore, the control unit 130 may not recommend to replace the first battery module B1 and the second battery module B2 with each other by outputting the first alarm code C1.

Conversely, if the SOC of the second battery module B2 is greater than or equal to the reference SOC, the control unit 130 may estimate the SOC of the first battery module B1 based on the first state information. In addition, the control unit 130 may compare the estimated SOC of the first battery module B1 with the SOC of the second battery module B2.

If the SOC of the first battery module B1 is smaller than the SOC of the second battery module B2, the control unit 130 may output the third alarm code C3 and terminate the determination of the replacement necessity.

That is, if the SOC of the second battery module B2 is greater than or equal to the reference SOC and the SOC of the first battery module B1 is smaller than the SOC of the second battery module B2 in the third determining operation, the control unit 130 may output the third alarm code C3.

Here, the third alarm code C3 may be an alarm code including a content that it is necessary to replace the first battery module B1 and the second battery module B2 with each other in order to minimize the performance deviation between the first battery module B1 and the second battery module B2.

Conversely, if the SOC of the second battery module B2 is greater than the reference SOC but smaller than the SOC of the first battery module B1, the control unit 130 may perform the fourth determining operation.

Next, the control unit 130 may perform the fourth determining operation to determine the replacement necessity based on the SOH of the first battery module B1 and the SOH of the second battery module B2.

Preferably, the control unit 130 may perform the fourth determining operation if it is determined in the third determining operation that the SOC of the second battery module B2 is equal to or greater than the reference SOC and smaller than the SOC of the first battery module B1.

The control unit 130 may determine whether it is necessary to replace the first battery module B1 and the second battery module B2 with each other and whether it is necessary to replace the first battery module B1 with a new battery module by performing the fourth determining operation.

First, the control unit 130 may estimate the SOH of the first battery module B1 and the second battery module B2. That is, the control unit 130 may estimate the SOH of the first battery module B1 based on the first state information and estimate the SOH of the second battery module B2 based on the second state information.

If the SOH of the first battery module B1 is greater than or equal to the SOH of the second battery module B2, the control unit 130 may output the first alarm code and terminate the determination of the replacement necessity. In this case, since the SOC and SOH of the first battery module B1 are respectively equal to or greater than the SOC and SOH of the second battery module B2, the control unit 130 may output the first alarm code C1. That is, in order to minimize the performance deviation between battery modules, it may not be recommended to replace the first battery module B1 and the second battery module B2 with each other.

Conversely, if the SOH of the first battery module B1 is smaller than the SOH of the second battery module B2, the control unit 130 may output the fourth alarm code C4 and terminate the determination of the replacement necessity.

Here, the fourth alarm code C4 may be an alarm code notifying that the first battery module B1 is in a more degraded state than the second battery module B2. Accordingly, the control unit 130 may output the fourth alarm code C4 including a content that it is necessary to replace the first battery module B1 with the second battery module B2 or it is necessary to replace the first battery module B1 with a new battery module.

The battery management apparatus 100 may sequentially perform a series of determining operations as above in order to minimize the performance deviation between the first battery module B1 and the second battery module B2 and to use the first battery module B1 and the second battery module B2 more efficiently.

Therefore, the battery management apparatus 100 has an advantage of inducing the user to use the first battery module B1 and the second battery module B2 equally without continuously using only one of the first battery module B1 and the second battery module B2.

The control unit 130 may be configured to determine the replacement necessity and then determine the replacement necessity again after a predetermined time passes.

Here, the predetermined time is a preset time, and may be a time until the control unit 130 determines the replacement necessity again after determining the replacement necessity first. Preferably, the predetermined time may be set to be greater than a minimum time required for the external device 200 to transmit a signal to the communication unit 110 and for the communication unit 110 to receive the signal.

For example, if the external device 200 and the communication unit 110 communicate with each other through a wireless channel, the predetermined time may be set to be greater than the sum of a propagation delay time and a transmission delay time required after the external device 200 transmits the first state information to the communication unit 110 until the communication unit 110 receives the first state information. For example, the predetermined time may be set to 1 second.

In the embodiment of FIG. 4, it is assumed that the control unit 130 outputs the second alarm code C2 and terminates the determination of first replacement necessity. The control unit 130 may perform the determination of second replacement necessity when a predetermined time passes from the termination time of determining the first replacement necessity. That is, the control unit 130 may perform the connection state determining operation again in order to determine the second replacement necessity. In this case, the control unit 130 may receive new first state information from the communication unit 110 and receive new second state information from the measuring unit 120, before the predetermined time passes. In addition, the control unit 130 may determine the second replacement necessity based on the new first state information and the new second state information.

The battery management apparatus 100 has an advantage of minimizing the performance deviation between the first battery module B1 and the second battery module B2 by determining at all times whether it is necessary to replace at least one of the first battery module B1 and the second battery module B2, rather than determining within a limited number of times.

In addition, the control unit 130 may be configured to change the predetermined time, if the external device 200 and the battery management apparatus 100 are coupled to each other.

That is, the battery management apparatus 100 may further include a connection unit to which the external device 200 may be coupled. If the external device 200 is coupled to the connection unit, the control unit 130 may receive a coupling completion signal from the connection unit. For example, a piezoelectric element is provided in the connection unit to output the coupling completion signal to the control unit 130 when the external device 200 is coupled to the connection unit.

The control unit 130 may change the predetermined time, when receiving the coupling completion signal from the connection unit.

Preferably, the control unit 130 may set the predetermined time when the external device 200 and the battery management apparatus 100 are connected to be longer than the predetermined time when the external device 200 and the battery management apparatus 100 are separated.

For example, if the external device 200 and the battery management apparatus 100 are separated, the operation states of the first battery module B1 and the second battery module B2 may be different from each other. That is, the first battery module B1 may be in a discharged state, and the second battery module B2 may be in a charged state. However, if the external device 200 and the battery management apparatus 100 are coupled, the operation states of the first battery module B1 and the second battery module B2 may be identically the charged state.

That is, an increase rate of the performance deviation of the first battery module B1 and the second battery module B2 in the same operation state may be significantly lower than an increase rate of the performance deviation of the first battery module B1 and the second battery module B2 in different operation states.

Accordingly, the control unit 130 may be configured to set the predetermined time when the external device 200 and the battery management apparatus 100 are separated and the predetermined time when the external device 200 and the battery management apparatus 100 are coupled differently.

The battery management apparatus 100 has an advantage of efficiently determining whether it is necessary to replace at least one of the first battery module B1 and the second battery module B2 by adjusting the time for determining the replacement necessity again based on whether the external device 200 and the battery management apparatus 100 are coupled.

The battery management apparatus 100 according to the present disclosure may be applied to a battery management system (BMS). That is, the BMS according to the present disclosure may include the battery management apparatus 100 according to the present disclosure described above. In this configuration, at least some components of the battery management apparatus 100 according to the present disclosure may be implemented by supplementing or adding functions of components included in a conventional BMS. For example, the communication unit 110, the measuring unit 120, the control unit 130 and the storage unit 140 of the battery management apparatus 100 may be implemented as components of the BMS.

In addition, the battery management apparatus 100 according to the present disclosure may be provided to a battery pack. That is, the battery pack according to the present disclosure may include the battery management apparatus 100 described above. Here, the battery pack may include at least one battery cell, the battery management apparatus 100, electrical equipment (including a relay, a fuse, etc.), and a case.

Figure 6:
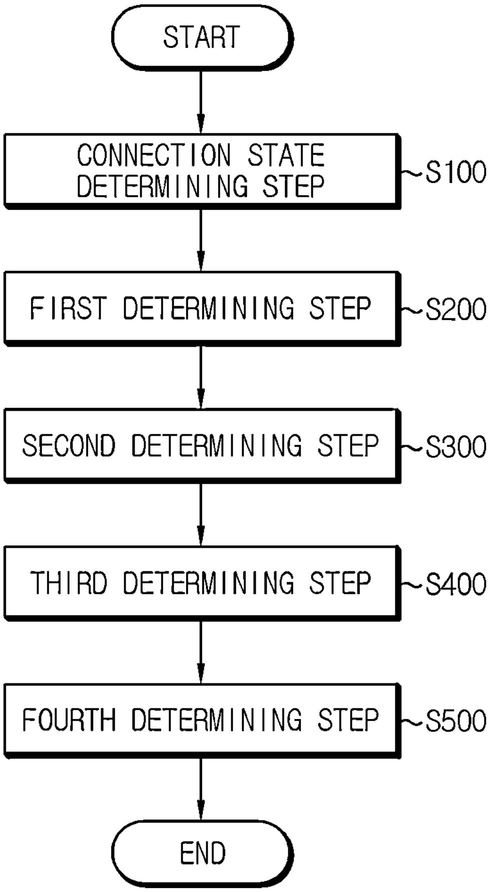
FIG. 6 is a diagram schematically showing a battery management method according to another embodiment of the present disclosure.

FIG. 6 is a diagram schematically showing a battery management method according to another embodiment of the present disclosure.

Referring to FIG. 6, the battery management method may include a connection state determining step (S100), a first determining step (S200), a second determining step (S300), a third determining step (S400), and a fourth determining step (S500). Here, the battery management method is performed by the battery management apparatus 100, and may preferably be performed by the control unit 130 of the battery management apparatus 100. Therefore, hereinafter, the contents overlapping with the contents described above in relation to the battery management apparatus 100 will be briefly described.

The connection state determining step (S100) is a step of determining a connection state between the first battery module B1 and the external device 200 and a connection state between the second battery module B2 and the measuring unit 120, and may be performed by the control unit 130.

As in the former embodiment, the external device 200 may communicate with the battery management apparatus 100. In particular, the external device 200 may communicate with the communication unit 110. The communication unit 110 may receive the first state information including at least one of voltage, current and temperature of the first battery module B1 from the external device 200. The communication unit 110 may transmit the first state information received from the external device 200 to the control unit 130.

The measuring unit 120 included in the battery management apparatus 100 may measure at least one of voltage, current and temperature of the second battery module B2 connected to the battery management apparatus 100. The measuring unit 120 may transmit second state information including at least one of voltage, current and temperature of the second battery module B2 to the control unit 130.

The control unit 130 may determine the connection state between the first battery module B1 and the external device 200 based on first state information received from the communication unit 110. Also, the control unit 130 may determine the connection state between the second battery module B2 and the battery management apparatus 100 based on the second state information received from the measuring unit 120.

If it is determined that the first battery module B1 and the second battery module B2 are connected to the external device 200 and the battery management apparatus 100, respectively, the first determining step (S200) may be performed.

If the first battery module B1 is connected to the external device 200 and the second battery module B2 is connected to the measuring unit 120, the first determining step (S200) may be performed by the control unit 130.

The control unit 130 may check the state of the first battery module B1. If the state of the first battery module B1 is a permanent failure state, the control unit 130 may output the fifth alarm code C5.

Conversely, if the state of the first battery module B1 is not a permanent failure state, the control unit 130 may determine whether the state of the second battery module B2 is a discharge protection state. That is, the control unit 130 may determine whether it is possible to discharge the second battery module B2.

For example, the control unit 130 may check the temperature of the second battery module B2 from the second state information. In addition, the control unit 130 may determine whether it is possible to discharge the second battery module B2 by comparing the temperature of the second battery module B2 with a preset discharge-possible maximum temperature.

If the temperature of the second battery module B2 exceeds the maximum discharge-possible temperature, the control unit 130 may determine the state of the second battery module B2 as a discharge protection state. In this case, the control unit 130 may determine whether the state of the second battery module B2 is a permanent failure state or a temporary failure state. If the state of the second battery module B2 is a permanent failure state, the control unit 130 may output the sixth alarm code C6. Conversely, if the state of the second battery module B2 is a temporary failure state, the control unit 130 may output the first alarm code C1.

If the temperature of the second battery module B2 is lower than the maximum discharge-possible temperature, the control unit 130 may determine that the state of the second battery module B2 is not a discharge protection state. That is, the control unit 130 may determine the state of the second battery module B2 as a discharge-possible state. In this case, the second determining step (S300) may be performed.

The second determining step (S300) is a step of determining whether it is necessary to replace at least one of the first battery module B1 and the second battery module B2 based on the rest period of the first battery module B1 and the rest period of the second battery module B2, if the state of the second battery module B2 is determined as a discharge-possible state in the first determining step (S200), and may be performed by the control unit 130.

As described above, the rest period means a period during which the voltage of the battery module is continuously maintained over a predetermined voltage.

The control unit 130 may estimate the rest period of the first battery module B1 based on the first state information. In addition, the control unit 130 may compare the estimated rest period of the first battery module B1 with a reference rest period.

If the rest period of the first battery module B1 is smaller than the reference rest period, the control unit 130 may estimate the rest period of the second battery module B2 based on the second state information. In addition, the control unit 130 may compare the estimated rest period of the second battery module B2 with the reference rest period.

If the rest period of the second battery module B2 is greater than or equal to the reference rest period, the control unit 130 may output the second alarm code C2. Conversely, if the rest period of the second battery module B2 is smaller than the reference rest period, the third determining step (S400) may be performed.

The third determining step (S400) is a step of determining the replacement necessity based on the SOC of the first battery module B1 and the SOC of the second battery module B2, if it is determined in the second determining step (S300) that it is not necessary to replace the first battery module B1 and the second battery module B2, and may be performed by the control unit 130.

The control unit 130 may estimate the SOC of the second battery module B2 based on the second state information. In addition, the control unit 130 may compare the estimated SOC of the second battery module B2 with a reference SOC.

If the SOC of the second battery module B2 is greater than or equal to the reference SOC, the control unit 130 may estimate the SOC of the first battery module B1 based on the first state information. In addition, the control unit 130 may compare the SOC of the first battery module B1 with the SOC of the second battery module B2.

If the SOC of the first battery module B1 is smaller than the SOC of the second battery module B2, the control unit 130 may output the third alarm code C3.

Conversely, if the SOC of the first battery module B1 is greater than or equal to the SOC of the second battery module B2, the fourth determining step (S500) may be performed.

The fourth determining step (S500) is a step of determining the replacement necessity based on the SOH of the first battery module B1 and the SOH of the second battery module B2, if it is determined in the third determining step (S400) that it is not necessary to replace the first battery module B1 and the second battery module B2, and may be performed by the control unit 130.

The control unit 130 may estimate the SOH of the first battery module B1 based on the first state information. In addition, the control unit 130 may estimate the SOH of the second battery module B2 based on the second state information.

The control unit 130 may compare the SOH of the first battery module B1 with the SOH of the second battery module B2. If the SOH of the first battery module B1 is smaller than the SOH of the second battery module B2, the control unit 130 may output the fourth alarm code C4. Conversely, if the SOH of the first battery module B1 is greater than or equal to the SOH of the second battery module B2, the control unit 130 may output the first alarm code C1.

After the battery management method is completely performed by the control unit 130, if a predetermined time elapses, the battery management method may be performed again by the control unit 130. Therefore, there is an advantage of inducing the first battery module B1 and the second battery module B2 to be used equally. In addition, since the alarm code corresponding to each determining step is output, there is an advantage that requirement necessity information of the first battery module B1 and the second battery module B2 may be provided in more detail.

Figure 7:
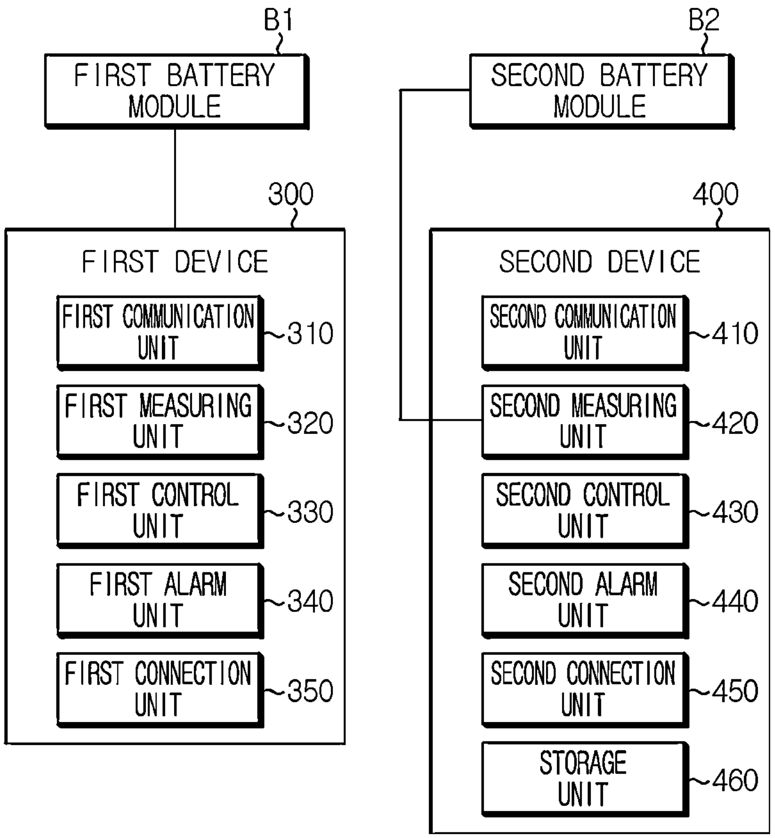
FIG. 7 is a diagram schematically showing a battery system according to still another embodiment of the present disclosure.

FIG. 7 is a diagram schematically showing a battery system according to still another embodiment of the present disclosure.

Referring to FIG. 7, the battery system may include a first device 300 and a second device 400. In addition, the first device 300 may be connected to the first battery module B1, and the second device 400 may be connected to the second battery module B2. In addition, the first device 300 and the second device 400 may be attachable to and detachable from each other.

Referring to FIGS. 2 and 7, in the battery system, the first device 300 may correspond to an external device capable of communicating with the battery management apparatus 100, and the second device 400 may correspond to the battery management apparatus 100 or a device including the battery management apparatus 100. That is, the first device 300 may be another embodiment of the external device, and the second device 400 may be another embodiment of the battery management apparatus 100 or a device including the battery management apparatus 100. For example, the first device 300 may be a portable cleaner, and the second device 400 may be a charging device for mounting and charging the portable cleaner. In this case, the battery management apparatus 100 may be regarded as being included in the charging device. As another embodiment, the second device 400 may be a portable cleaner, and the first device 300 may be a charging device. In this case, that the battery management apparatus 100 according to the present disclosure described above may be regarded as being included in the portable cleaner.

Figure 8:
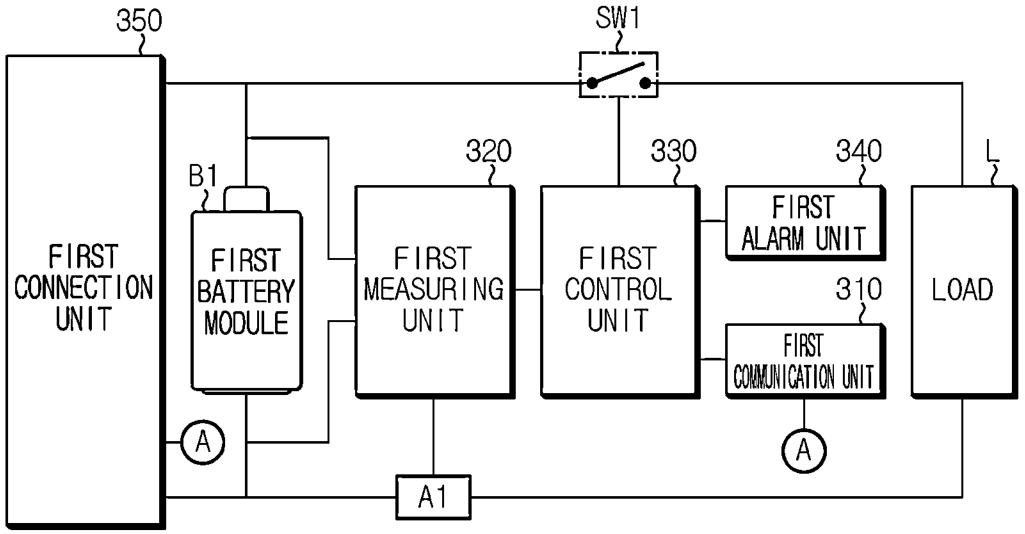
FIG. 8 is a diagram showing an exemplary configuration of a first device, in the battery system according to still another embodiment of the present disclosure.

FIG. 8 is a diagram showing an exemplary configuration of a first device 300, in the battery system according to still another embodiment of the present disclosure.

Referring to FIGS. 7 and 8, the first device 300 may include a first communication unit 310, a first measuring unit 320, and a first control unit 330. The first device 300 may be connected to a load L. That is, the load L may receive power from the first battery module B1 connected to the first device 300.

If the first battery module B1 is connected, the first measuring unit 320 may measure at least one of voltage, current and temperature of the first battery module B1.

For example, if the first battery module B1 is connected, the first measuring unit 320 may measure the voltage of the first battery module B1 by measuring a positive electrode potential and a negative electrode potential of the first battery module B1 and calculating a potential difference between the measured positive and negative potentials. In addition, the first measuring unit 320 may measure the current of the first battery module B1 through a first current system A1 provided on a charge and discharge path of the first battery module B1. In addition, the first measuring unit 320 may measure the temperature of the first battery module B1 using a temperature sensor or the like.

The first communication unit 310 may be configured to transmit first state information including at least one of voltage, current and temperature of the first battery module B1 measured by the first measuring unit 320 to the second device 400. Specifically, the first communication unit 310 may communicate with a second communication unit 410.

The first control unit 330 may be connected to the first measuring unit 320 and the first communication unit 310. If at least one of voltage, current and temperature of the first battery module B1 is measured by the first measuring unit 320, the first control unit 330 may command the first communication unit 310 to transmit the first state information including the same to the second device 400.

In addition, the first control unit 330 may control an operation state of a first switch SW1 provided on the charge and discharge path of the first battery module B1. Accordingly, if a turn-off command for the first switch SW1 is input from the outside or the first battery module B1 is discharged for a long time, the first control unit 330 may control the operation state of the first switch SW1 to a turn-off state.

Figure 9:
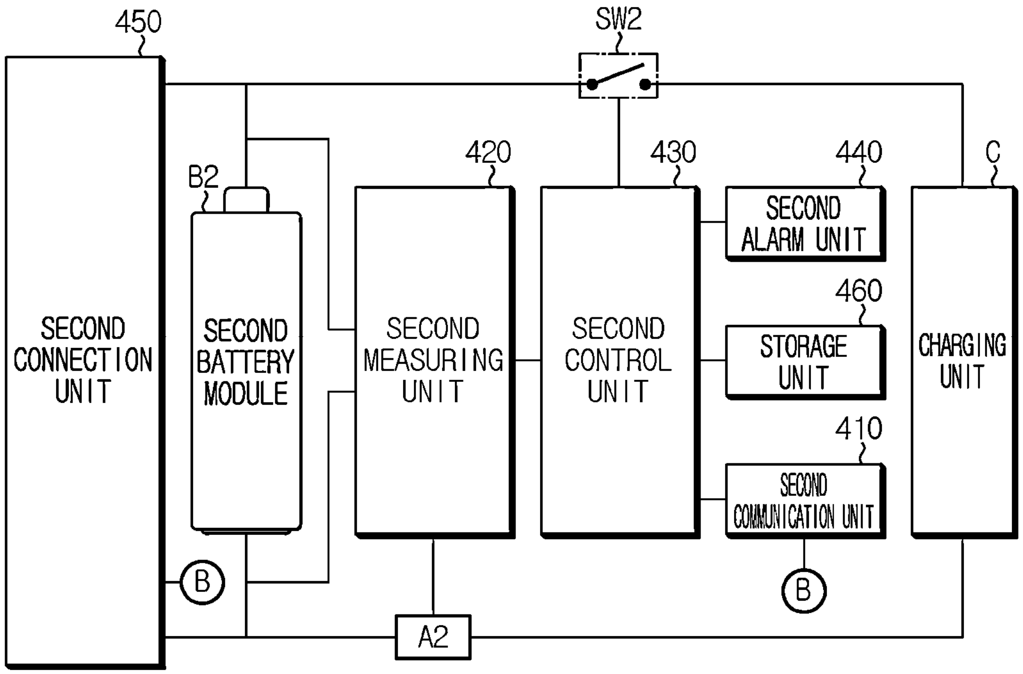
FIG. 9 is a diagram showing an exemplary configuration of a second device, in the battery system according to still another embodiment of the present disclosure.

FIG. 9 is a diagram showing an exemplary configuration of a second device 400, in the battery system according to still another embodiment of the present disclosure.

Referring to FIGS. 7 and 9, the second device 400 may include a second communication unit 410, a second measuring unit 420, a second control unit 430, and a storage unit 460. The second device 400 may be connected to a charging unit C. That is, the charging unit C may charge the second battery module B2 connected to the second device 400.

If the second battery module B2 is connected, the second measuring unit 420 may measure at least one of voltage, current and temperature of the second battery module B2. In this case, the second measuring unit 420 may measure the current of the second battery module B2 by using a second current system A2 provided on a charge and discharge path of the second battery module B2.

The second communication unit 410 may receive the first state information from the first communication unit 310.

The second control unit 430 may receive second state information including at least one of voltage, current and temperature of the second battery module B2 from the second measuring unit 420. In addition, the second control unit 430 may receive the first state information received from the first device 300 from the second communication unit 410.

The second control unit 430 may determine whether it is necessary to replace at least one of the first battery module B1 and the second battery module B2 based on the first state information and the second state information.

At this time, the second control unit 430 may estimate the SOC of the first battery module B1 from the first state information and estimate the SOC of the second battery module B2 from the second state information by referring to the look-up table stored in the storage unit 460.

In addition, the second control unit 430 may output an alarm code corresponding to the determination result.

The operation performed by the second control unit 430 to determine the replacement necessity and output the alarm code corresponding to the determination result may be identical to the operation performed by the control unit 130 of the battery management apparatus 100 in FIGS. 3 to 5.

In addition, the second control unit 430 may control an operation state of a second switch SW2 provided on the charge and discharge path of the second battery module B2. Accordingly, if a turn-off command for the second switch SW2 is input from the outside or the second battery module B2 is charged for a long time, the second control unit 430 may control the operation state of the second switch SW2 to a turn-off state.

At least one of the first device 300 and the second device 400 may further include an alarm unit. For example, only one of the first device 300 and the second device 400 may include an alarm unit, and both the first device 300 and the second device 400 may include an alarm unit.

Here, the alarm unit is an output unit capable of outputting an alarm corresponding to the alarm code output from the second control unit 430, and may be configured to output at least one of light, sound, letter and symbol.

The alarm unit may output different alarms respectively corresponding to the second alarm code C2, the third alarm code C3, the fourth alarm code C4, the fifth alarm code C5 and the sixth alarm code C6.

Therefore, the battery system has an advantage of providing the replacement necessity for the first battery module B1 and the second battery module B2 in a specific and intuitive way.

For example, referring to FIG. 7, the first device 300 may further include a first alarm unit 340, and the second device 400 may further include a second alarm unit 440. Hereinafter, for convenience of description, the case where both the first device 300 and the second device 400 include an alarm unit will be described.

Each of the first alarm unit 340 and the second alarm unit 440 may be configured to receive the alarm code output from the second device 400.

Referring to FIGS. 8 and 9, the first communication unit 310 may receive the alarm code output from the second control unit 430 through the second communication unit 410. In addition, the alarm code received by the first communication unit 310 may be transmitted to the first alarm unit 340 through the first control unit 330. The first alarm unit 340 may output an alarm corresponding to the received alarm code.

In addition, the alarm code output from the second control unit 430 may also be transmitted to the second alarm unit 440. The second alarm unit 440 may output an alarm corresponding to the alarm code received from the second control unit 430.

The first battery module B1 may be configured to be replaced with the second battery module B2. Preferably, the first battery module B1 and the second battery module B2 may be battery modules that are attachable to and detachable from the first device 300 and the second device 400. That is, the first battery module B1 and the second battery module B2 may be compatible products.

Therefore, the battery system has an advantage of minimizing the performance deviation between the first battery module B1 and the second battery module B2 by determining the replacement necessity of the first battery module B1 and the second battery module B2.

Figure 10:
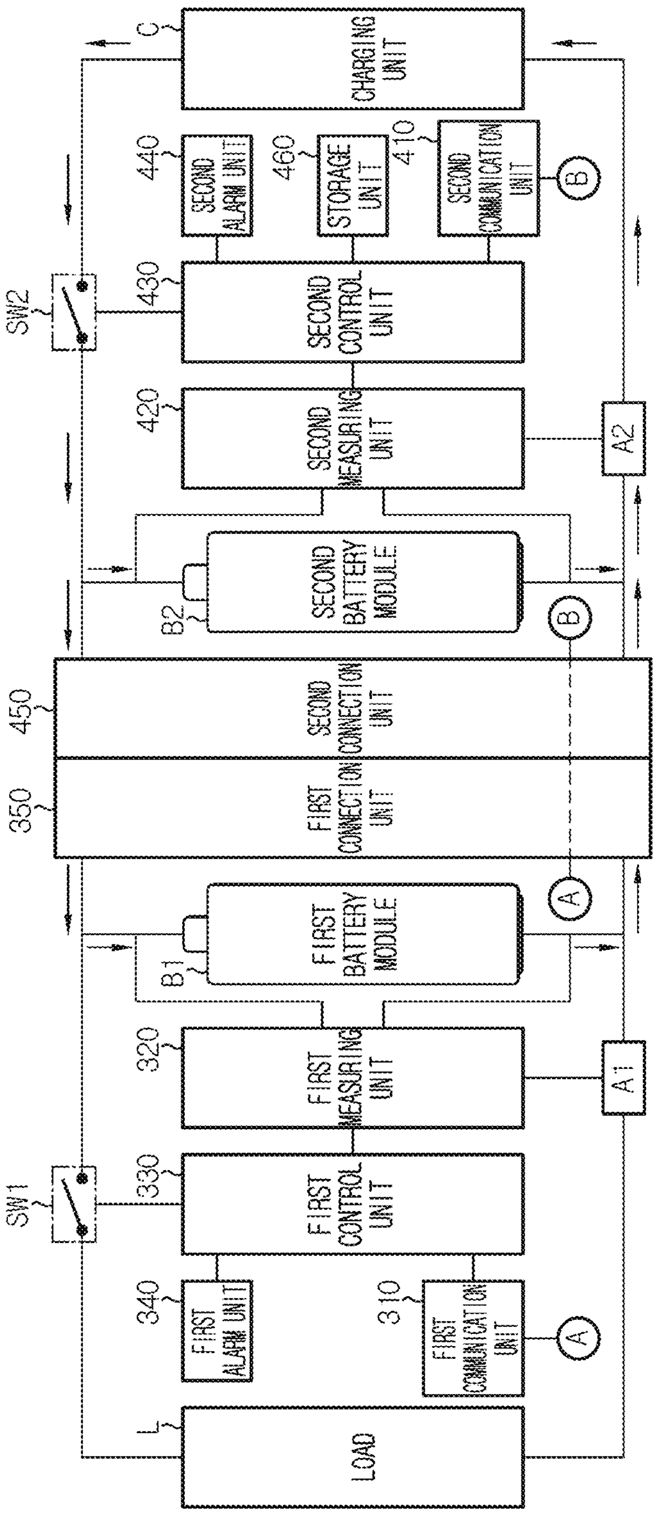
FIG. 10 is a diagram showing an exemplary configuration where the first device and the second device are coupled, in the battery system according to still another embodiment of the present disclosure.

FIG. 10 is a diagram showing an exemplary configuration where the first device 300 and the second device 400 are coupled, in the battery system according to still another embodiment of the present disclosure.

Referring to FIG. 10, the first device 300 may further include a first connection unit 350. In addition, the second device 400 may further include a second connection unit 450. The first device 300 and the second device 400 may be connected to each other through the first connection unit 350 and the second connection unit 450.

In this case, as in the embodiment of FIG. 10, the first battery module B1 and the second battery module B2 may be simultaneously charged by the charging unit C. At this time, the current may flow in a direction of an arrow shown in FIG. 10.

Further, referring to FIG. 10, the first communication unit 310 may be connected to the first connection unit 350 through an A line, and the second communication unit 410 may be connected to the second connection unit 450 through a B line. In addition, if the first connection unit 350 and the second connection unit 450 are connected, the A line and the B line may be connected to each other.

That is, as shown in FIG. 10, if the first connection unit 350 and the second connection unit 450 are connected, the first communication unit 310 and the second communication unit 410 may communicate with each other through a wired line. In this case, the communication speed of the first communication unit 310 and the second communication unit 410 may be faster.

The second control unit 430 determines whether it is necessary to replace at least one of the first battery module B1 and the second battery module B2 based on whether the first device 300 and the second device 400 are connected, and then change the time (the predetermined time) taken to determine the replacement necessity again.

For example, as shown in FIG. 10, if the first device 300 and the second device 400 are connected, both the first battery module B1 and the second battery module B2 may be charged. Conversely, if the first device 300 and the second device 400 are separated, the first battery module B1 may be discharged and the second battery module B2 may be charged.

That is, an increase rate of the performance deviation between the first battery module B1 and the second battery module B2 when both the first battery module B1 and the second battery module B2 are charged may be significantly lower than an increase rate of the performance deviation when the first battery module B1 is discharged and the second battery module B2 is charged.

Accordingly, the second control unit 430 may set the predetermined time differently when the first device 300 and the second device 400 are connected and when the first device 300 and the second device 400 are separated. Preferably, if the first device 300 and the second device 400 are connected, the second control unit 430 may set the predetermined time longer than the case where the first device 300 and the second device 400 are separated.

For example, the second control unit 430 may set the predetermined time to 1 second when the first device 300 and the second device 400 are separated, and change the predetermined time to 1.2 seconds when the first device 300 and the second device 400 are connected.

Therefore, the battery system has an advantage of efficiently determining the replacement necessity of the first battery module B1 and the second battery module B2 by setting the time required to determine the replacement necessity according to the connection state of the first device 300 and the second device 400.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

100: battery management apparatus
110: communication unit
120: measuring unit
130: control unit
140: storage unit
200: external device
300: first device
310: first communication unit
320: first measuring unit
330: first control unit
340: first alarm unit
350: first connection unit
400: second device
410: second communication unit
420: second measuring unit
430: second control unit
440: second alarm unit
450: second connection unit
460: storage unit
B1: first battery module
B2: second battery module

What is claimed is:

1. A battery system, comprising:

a battery management apparatus including:
- a communicator configured to receive, from an external device, first state information including at least one of voltage, current, and temperature of a first battery module connected to the external device;
- a measurer configured to measure at least one of voltage, current, and temperature of a second battery module connected to the measurer; and
- a controller configured to:
  - receive the first state information from the communicator;
  - receive second state information from the measurer, including the at least one of voltage, current, and temperature of the second battery module; and
  - determine whether it is necessary to replace at least one of the first battery module and the second battery module, based on the first state information and the second state information; and the second battery module, wherein the second battery module is attachable to and detachable from the external device, and wherein the controller is further configured to:
- estimate at least one of a rest period, an SOC (State Of Charge), and an SOH (State Of Health) of the first battery module, based on the first state information;
- estimate at least one of a rest period, an SOC, and an SOH of the second battery module, based on the second state information;
- perform a first determining operation of determining whether it is necessary to replace at least one of the first battery module and the second battery module, based on a state of the first battery module and a state of the second battery module, the state of the second battery module including whether the second battery module is in a discharge protection state;
- if the second battery module is not in the discharge protection state, perform a second determining operation of determining whether it is necessary to replace at least one of the first battery module and the second battery module, based on the rest period of the first battery module and the rest period of the second battery module;
- if the rest period of the first battery module and the rest period of the second battery module are smaller than a reference rest period, perform a third determining operation of determining whether it is necessary to replace at least one of the first battery module and the second battery module, based on the SOC of the first battery module and the SOC of the second battery module; and if the SOC of the second battery module is greater than or equal to a reference SOC and less than or equal to the SOC of the first battery module, perform a fourth determining operation of determining whether it is necessary to replace at least one of the first battery module and the second battery module, based on the SOH of the first battery module and the SOH of the second battery module.

2. The battery system according to claim 1, wherein the controller is further configured to determine whether it is necessary to replace at least one of the first battery module and the second battery module, only when:

the first battery module is connected to the external device; and the second battery module is connected to the measurer.

3. The battery system according to claim 2, wherein the controller is further configured to determine again whether it is necessary to replace at least one of the first battery module and the second battery module, after a predetermined time passes from a prior determination of whether it is necessary to replace at least one of the first battery module and the second battery module.

4. The battery system according to claim 3, wherein the controller is further configured to change the predetermined time, when the external device and the battery management apparatus are connected to each other.

5. The battery system according to claim 1, wherein, in the first determining operation, the controller is further configured to:

determine whether or not to replace at least one of the first battery module and the second battery module with a new battery module, based on the state of the first battery module and the state of the second battery module.

6. The battery system according to claim 1, wherein, in the second determining operation, the controller is further configured to:

output an alarm code, among a plurality of alarm codes, to replace the first battery module and the second battery module with each other, if:

the rest period of the first battery module is smaller than the reference rest period; and the rest period of the second battery module is equal to or greater than the reference rest period; and proceed to the third determining operation, if the rest periods of both the first battery module and the second battery module are smaller than the reference rest period.

7. The battery system according to claim 1, wherein in the third determining operation, the controller is further configured to:

output an alarm code, among a plurality of alarm codes, to replace the first battery module and the second battery module with each other, if:

the SOC of the second battery module is equal to or greater than the reference SOC; and the SOC of the first battery module is smaller than the SOC of the second battery module; and proceed to the fourth determining operation, if:

the SOC of the second battery module is equal to or greater than the reference SOC; and the SOC of the first battery module is equal to or greater than the SOC of the second battery module.

8. The battery system according to claim 1, wherein, in the fourth determining operation, the controller is further configured to output an alarm code, among a plurality of alarm codes, to replace the first battery module with a new battery module, if the SOH of the first battery module is smaller than the SOH of the second battery module.

9. A battery management method for the battery system according to claim 1, the battery management method comprising:

a connection state determining operation of determining:

a connection state between the first battery module and the external device, the first battery module being attachable to and detachable from the external device; and a connection state between the second battery module and the measurer in the battery system, the second battery module being attachable to and detachable from the external device;

the first determining operation of determining whether it is necessary to replace at least one of the first battery module and the second battery module, based on the state of the first battery module and the state of the second battery module, and whether it is possible to discharge the second battery module, if it is determined in the connection state determining operation that:

the first battery module is connected to the external device; and the second battery module is connected to the measurer, the second determining operation of determining whether it is necessary to replace at least one of the first battery module and the second battery module, based on the rest period of the first battery module and the rest period of the second battery module, if it is determined in the first determining operation that it is possible to discharge the second battery module;

the third determining operation of determining whether it is necessary to replace at least one of the first battery module and the second battery module, based on the SOC of the first battery module and the SOC of the second battery module, if it is determined in the second determining operation that it is not necessary to replace the first battery module and the second battery module; and the fourth determining operation of determining whether it is necessary to replace at least one of the first battery module and the second battery module, based on the SOH of the first battery module and the SOH of the second battery module, if it is determined in the third determining operation that it is not necessary to replace the first battery module and the second battery module.

10. The battery management method of claim 9, wherein the second battery module is compatible with the first battery module.

11. The battery system of claim 1, wherein:

the second battery module is compatible with the first battery module; and the first battery module is attachable to and detachable from the battery management apparatus.

12. A battery system, comprising:

a first device and a second device attachable to and detachable from each other, wherein the first device is configured to, when a first battery module is connected to the first device:

measure at least one of voltage, current, and temperature of the first battery module; and transmit first state information, including at least one of the measured voltage, current, and temperature of the first battery module, to the second device, wherein the second device is configured to, when a second battery module is connected to the second device:

measure at least one of voltage, current, and temperature of the second battery module;

determine whether it is necessary to replace at least one of the first battery module and the second battery module, based on:

second state information, including at least one of the measured voltage, current, and temperature of the second battery module, and the first state information received from the first device; and wherein the second device is further configured to:

estimate at least one of a rest period, an SOC (State Of Charge), and an SOH (State Of Health) of the first battery module, based on the first state information;

estimate at least one of a rest period, an SOC, and an SOH of the second battery module, based on the second state information;

perform a first determining operation of determining whether it is necessary to replace at least one of the first battery module and the second battery module, based on a state of the first battery module and a state of the second battery module, the state of the second battery module including whether the second battery module is in a discharge protection state;

if the second battery module is not in the discharge protection state, perform a second determining operation of determining whether it is necessary to replace at least one of the first battery module and the second battery module, based on the rest period of the first battery module and the rest period of the second battery module;

if the rest period of the first battery module and the rest period of the second battery module are smaller than a reference rest period, perform a third determining operation of determining whether it is necessary to replace at least one of the first battery module and the second battery module, based on the SOC of the first battery module and the SOC of the second battery module; and if the SOC of the second battery module is greater than or equal to a reference SOC and less than or equal to the SOC of the first battery module, perform a fourth determining operation of determining whether it is necessary to replace at least one of the first battery module and the second battery module, based on the SOH of the first battery module and the SOH of the second battery module.

13. The battery system according to claim 12, wherein the first battery module is configured to be replaceable with the second battery module.

14. The battery system of claim 12, wherein the second battery module is compatible with the first battery module.

* * * * *